(12) United States Patent
Gao et al.

(10) Patent No.: US 10,283,477 B2
(45) Date of Patent: May 7, 2019

(54) METHOD OF FABRICATING 3-DIMENSIONAL FAN-OUT STRUCTURE

(71) Applicant: NXP USA, INC., Austin, TX (US)

(72) Inventors: Wei Gao, Tianjin (CN); Zhiwei Gong, Chandler, AZ (US); Dehong Ye, Tianjin (CN)

(73) Assignee: NXP USA, INC., Austin, TX (US)

( * ) Notice: Subject to any disclaimer, the term of this patent is extended or adjusted under 35 U.S.C. 154(b) by 23 days.

(21) Appl. No.: 15/355,069

(22) Filed: Nov. 18, 2016

(65) Prior Publication Data

US 2017/0200701 A1 Jul. 13, 2017

(30) Foreign Application Priority Data

Jan. 12, 2016 (CN) .......................... 2016 1 0163609

(51) Int. Cl.
*H01L 23/00* (2006.01)
*H01L 21/48* (2006.01)
*H01L 23/498* (2006.01)

(52) U.S. Cl.
CPC ............ *H01L 24/32* (2013.01); *H01L 21/486* (2013.01); *H01L 21/4853* (2013.01); *H01L 21/4857* (2013.01); *H01L 23/49822* (2013.01); *H01L 23/49827* (2013.01); *H01L 23/49838* (2013.01); *H01L 24/16* (2013.01); *H01L 24/19* (2013.01); *H01L 24/20* (2013.01); *H01L 24/13* (2013.01); *H01L 24/73* (2013.01); *H01L 24/92* (2013.01); *H01L 2224/0401* (2013.01); *H01L 2224/04105* (2013.01); *H01L 2224/12105* (2013.01); *H01L 2224/131* (2013.01); *H01L 2224/16227* (2013.01); *H01L 2224/16235* (2013.01); *H01L 2224/24195* (2013.01); *H01L 2224/32145* (2013.01); *H01L 2224/32225* (2013.01); *H01L 2224/73203* (2013.01); *H01L 2224/73204* (2013.01); *H01L 2224/73267* (2013.01); *H01L 2224/92125* (2013.01);

(Continued)

(58) Field of Classification Search
CPC . H01L 2224/24145; H01L 2224/48145; H01L 21/56; H01L 2224/15311; H01L 23/49827; H01L 2924/3011; H01L 2924/181; H01L 2924/18161
USPC .......................... 257/701, 758, 787, 686, 777
See application file for complete search history.

(56) References Cited

U.S. PATENT DOCUMENTS

| 5,608,262 | A  * | 3/1997 | Degani ................. H01L 23/13 257/723 |
| 6,365,963 | B1 * | 4/2002 | Shimada ............... H01L 21/563 257/686 |
| 7,579,690 | B2   | 8/2009 | Chia |

(Continued)

*Primary Examiner* — S. V. Clark
(74) *Attorney, Agent, or Firm* — Charles E. Bergere

(57) ABSTRACT

A method of fabricating a 3D fan-out structure for an integrated circuit device includes providing a substrate carrier having first and second opposing surfaces and an aperture extending between the first and second surfaces. A first semiconductor die is bonded to the first surface of the substrate carrier such that the first die covers the aperture of the substrate carrier. An encapsulant and a second die are deposited within the aperture of the substrate carrier such that an active surface of the second die is exposed and coplanar with the second surface of the substrate carrier. One or more redistribution layers are then applied on the second surface of the substrate carrier to form a 3D fan-out structure.

6 Claims, 3 Drawing Sheets

(52) U.S. Cl.
CPC ............... *H01L 2224/92244* (2013.01); *H01L 2924/15151* (2013.01); *H01L 2924/15311* (2013.01)

(56) References Cited

U.S. PATENT DOCUMENTS

| | | | |
|---|---|---|---|
| 8,216,918 B2 | 7/2012 | Gong | |
| 8,518,746 B2 | 8/2013 | Pagaila | |
| 8,884,422 B2 * | 11/2014 | Goh | H01L 25/16 257/686 |
| 8,937,381 B1 * | 1/2015 | Dunlap | H01L 23/3128 257/686 |
| 2002/0153604 A1 * | 10/2002 | Vaiyapuri | H01L 23/49827 257/686 |
| 2006/0145328 A1 * | 7/2006 | Hsu | H01L 23/5389 257/690 |
| 2006/0214278 A1 * | 9/2006 | Martin | H01L 23/552 257/686 |
| 2007/0111398 A1 | 5/2007 | Hsu | |
| 2011/0147911 A1 * | 6/2011 | Kohl | H01L 21/6835 257/686 |
| 2013/0105991 A1 * | 5/2013 | Gan | H01L 25/105 257/777 |

* cited by examiner

METHOD OF FABRICATING 3-DIMENSIONAL FAN-OUT STRUCTURE

BACKGROUND

The present invention relates generally to a method of fabricating a 3-dimensional fan-out structure and, more particularly to a method of fabricating a 3-dimensional fan-out structure for an integrated circuit device.

Fan-out wafer level packaging (WLP) enables 3-dimensional (3D) structures to be implemented within integrated circuit devices through vertical integration of semiconductor dies within a single integrated circuit package. As such, fan-out WLP has become an important technique for increasing the functionality that can be integrated within a single integrated circuit device.

Conventional techniques for fabricating wafer level fan-out within an integrated circuit device typically involve processes such as panelization processes, through package via processes and double sided build-up processes. Such processes add significant cost, manufacturability and reliability issues to the fabrication of wafer level fan-out within integrated circuit devices.

For example, with conventional FOWLP (Fan-Out Wafer Level Package) fabrication, the die and components are usually placed onto a temporary tape/carrier 'face down' (i.e., 'active' side in contact with the tape/carrier) to make sure the die and components are co-planar. Encapsulation follows to assemble the die and components into a 'panel' form ready for build-up. In order to perform the build-up on the active side of the die and components, the panel is flipped over and the tape/carrier removed. The tape/carrier removal process usually involves specialized thermal, optical or mechanical processes which complicate the production flow and increase cost. At the same time, because the die and components are placed prior to encapsulation, shrinking of the encapsulant can cause 'die drift', which can result in a large yield loss. Die drift is especially problematic when FOWLP is used for large panel sizes and with fine pitch products.

In addition to the complication of process flow and challenge of die drift, the taping/carrier process can also result in undesired topography on the panel. This is due to the die/components penetrating into the tape/carrier adhesive during placement, as illustrated in FIG. 1. As a result, when subsequently encapsulated and the tape/carrier removed, the regions of the die/components that penetrated the adhesive will protrude from the surface of the encapsulant creating chip-to-mold or component-to-mold non-planarity, as illustrated in FIG. 2. Such non-planarity can impact build-up layer continuity and create stress at the die/component level following build-up of the redistribution layers, potentially resulting in damage to the dies/components and the redistribution layers, as well as resulting in adhesive voids.

Accordingly, a technique for fabricating wafer level fan-out within an integrated circuit device that does not involve such lengthy, high yield loss and complicated processes would help to reduce the cost and improve the manufacturability and reliability of such integrated circuit devices.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
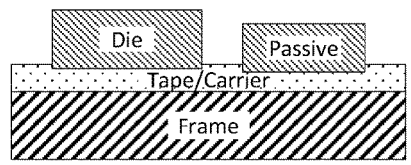
FIG. 1 is a simplified cross-sectional illustration of the problem of dies/components penetrating into tape/carrier adhesive during placement.
Figure 2:
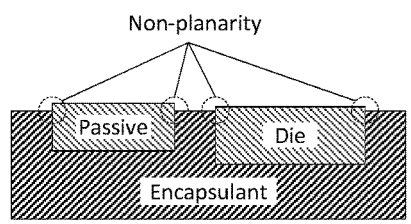
FIG. 2 is a simplified cross-sectional illustration of the problem of non-planarity of dies/components following encapsulation as a result of their penetration into tape/carrier adhesive.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides for a method of fabricating a 3D fan-out structure for an integrated circuit device. The method includes providing a substrate carrier comprising first and second opposing surfaces and an aperture extending there through between the first and second surfaces, bonding a first semiconductor die to the first surface of the substrate carrier such that the first semiconductor die covers the aperture of the substrate carrier, depositing an encapsulant and a second semiconductor die within the aperture of the substrate carrier such that an active surface of the second semiconductor die is exposed and coplanar with the second surface of the substrate carrier, and applying at least one redistribution layer onto the second surface of the substrate carrier to form a 3D fan-out structure.

In another embodiment, the present invention provides for a 3-Dimensional fan-out structure for an integrated circuit device. The 3D fan-out structure includes a substrate carrier comprising first and second opposing surfaces and an aperture extending there through between the first and second surfaces, a first semiconductor die bonded to the first surface of the substrate carrier such that the first semiconductor die covers the aperture of the substrate carrier, an encapsulant and a second semiconductor die located within the aperture of the substrate carrier such that an active surface of the second semiconductor die is exposed and coplanar with the second surface of the substrate carrier, and at least one redistribution layer applied onto the second surface of the substrate carrier.

In another embodiment, the present invention provides for an integrated circuit device comprising such a 3D fan-out structure for an integrated circuit device.

Referring now to FIGS. 3 to 9, a series of simplified cross-sectional build-up figures showing an example of a method of fabricating a 3-Dimensional fan-out structure for an integrated circuit device is shown. The method starts at FIG. 3, where a substrate carrier 300 is provided. The substrate carrier 300 may be formed of any suitable insulating material, for example CCL substrate (Copper Clad Laminate substrate). The substrate carrier 300 has first and second opposing surfaces 310, 320, and an aperture 330 extending there through. In some examples, the substrate carrier 300 may have conductive tracks or pads 340 formed on or in the surfaces 310, 320 thereof. The substrate carrier 300 may further include one or more conductive vias 350 extending there through, for example between conductive contact tracks/pads 340.

Figure 4:
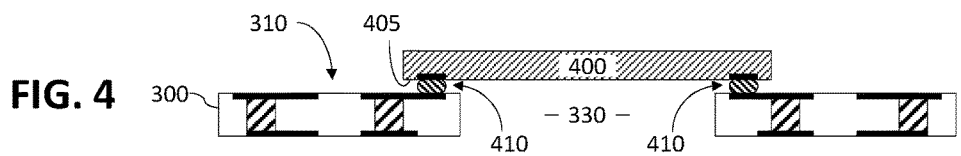

As illustrated in FIG. 4, a first semiconductor die 400 is bonded to the first surface 310 of the substrate carrier 300 such that the first semiconductor die 400 covers the aperture 330 of the substrate carrier 300. Any suitable bonding technique may be used for bonding the first semiconductor die 400 to the first surface 310 of the substrate carrier 300. For example, and as illustrated in FIGS. 4 to 8, the first semiconductor die 400 may be flip-chip bonded to the first surface 310 of the substrate carrier 300 using a solder ball surface-mount technique, whereby 'balls' of solder paste 410 are used to mechanically and electrically bond contact pads located around a peripheral region of an active surface 405 of the first semiconductor die 400 to conductive pads 340 located on or in the first surface 310 of the substrate carrier 300, adjacent to the edge of the aperture 330.

Figure 5:
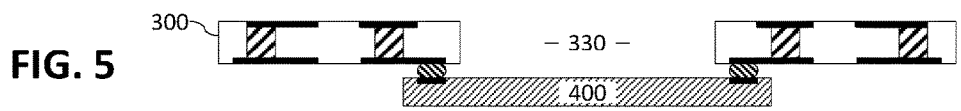

Having bonded the first semiconductor die 400 to the first surface 310 of the substrate carrier 300, the substrate carrier 300 is 'flipped' over or otherwise re-orientated (if necessary) such that the first semiconductor die 400 is located beneath the substrate carrier 300, as illustrated in FIG. 5.

Figure 6:
Figure 7:
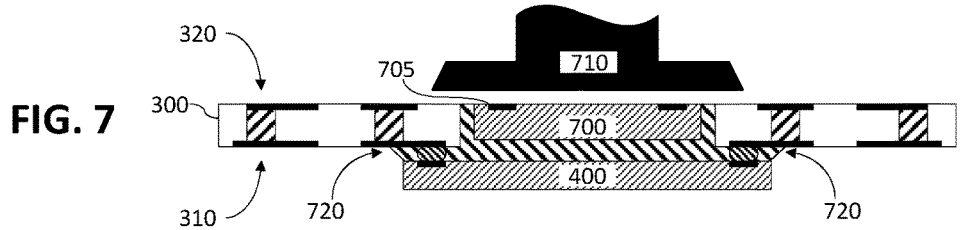

In the example method illustrated in FIGS. 3 to 9, an encapsulant 600 such as epoxy is the dispensed into the aperture 330 within the substrate carrier 300, as illustrated in FIG. 6. A second semiconductor die 700 is then deposited into the encapsulant within the aperture 330 of the substrate carrier 300 such that an active surface 705 of the second semiconductor die 700 is exposed and coplanar with the second surface 320 of the substrate carrier 300, as illustrated in FIG. 7. Placement force applied to the second semiconductor die 700 helps to improve the under-fill 720 of the encapsulant 600 between the first semiconductor die 400 and the first surface 310 of the substrate carrier 300. An 'oversized' pick & place nozzle 710 can be used to ensure the active surface 705 of the second semiconductor die 700 is coplanar with the second surface 320 of the substrate carrier 300.

Significantly, by initially bonding the first semiconductor die 400 to the first surface 310 of the substrate carrier 300 such that it covers the aperture 330, a well-type formation is created when the substrate carrier is subsequently flipped over within which the encapsulant 600 and second semiconductor die 700 can be deposited without the need for a temporary tape/carrier, and thus avoiding an additional process for removing the tape/carrier. Furthermore, the planarity of the active surface 705 of the second semiconductor die 700 with the second surface 320 of the substrate carrier 300 can be more easily achieved than through the use of temporary tape/carrier processes.

Figure 8:
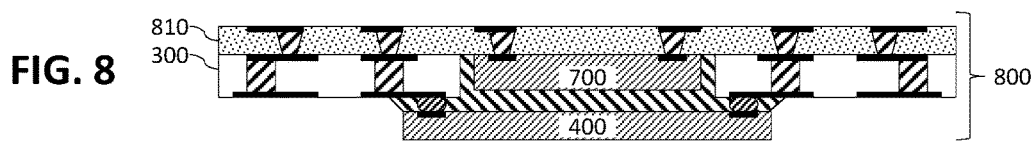
Figure 9:
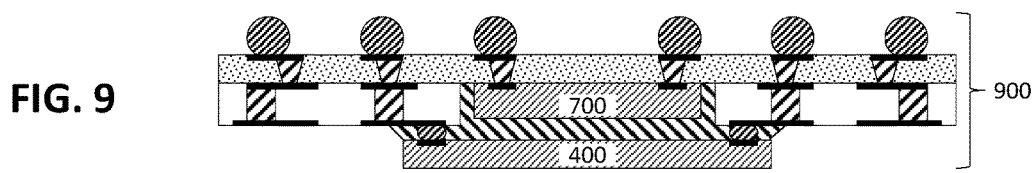
Figure 11:
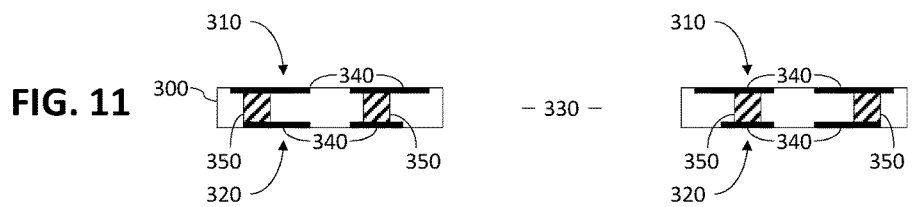
FIGS. 11 to 18 illustrate a series of simplified cross-sectional build-up figures showing an alternative example of a method of fabricating a 3D fan-out structure for an integrated circuit device.

Once the encapsulant 600 has cured, one or more redistribution layers, such as illustrated generally at 810 in FIG. 8, are then applied (built up) onto the second surface 320 of the substrate carrier 300 to form a 3-Dimensional fan-out structure 800. Ball-attach and singulation of the 3D fan-out structure 800 can then be performed to form an individual integrated circuit device 900, as illustrated in FIG. 9.

Figure 10:
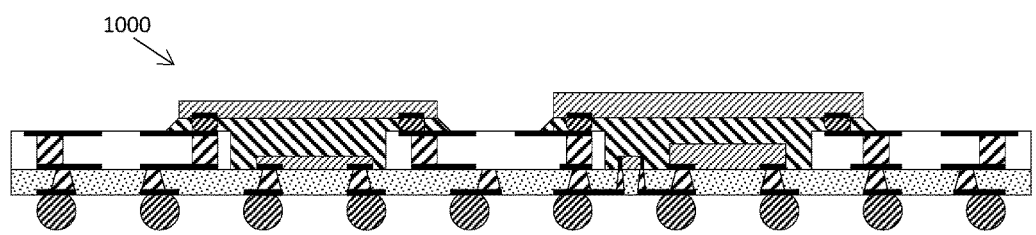
FIG. 10 is a simplified cross-sectional illustration of an example of a 3D fan-out structure having multiple dies and components.
Figure 3:
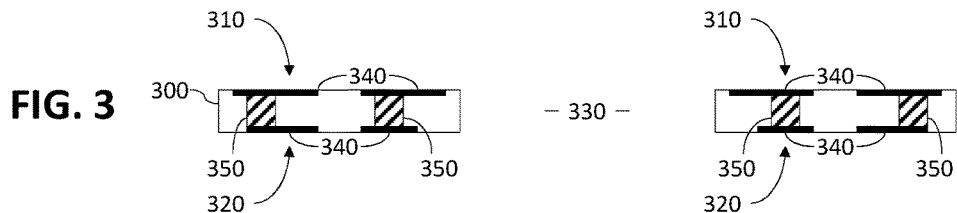
FIGS. 3 to 9 illustrate a series of simplified cross-sectional build-up figures showing an example of a method of fabricating a 3D fan-out structure for an integrated circuit device in accordance with an embodiment of the present invention.

Advantageously, as can be seen from the illustrated example, neither of the semiconductor dies 400, 700 are required to be of equal thickness to the substrate carrier 300, nor to be of equal thickness relative to one another, restrictions of many conventional fabrication techniques, enabling greater flexibility and variation with respect to the semiconductor die shapes and sizes. In particular, the ability to fabricate a 3-Dimensional fan-out structure with semiconductor dies of different thicknesses relative to the substrate carrier 300 and to one another is particularly beneficial when fabricating a module consisting of multiple dies and components, such as the integrated circuit module 1000 illustrated in FIG. 10.

Thus, a simplified, low cost process flow is provided for fabricating a 3D fan-out structure that enables achieves good manufacturability and reliability of the resulting integrated circuit devices.

Referring now to FIGS. 11 to 18, there is illustrated a series of simplified cross-sectional build-up figures showing an alternative example of a method of fabricating a 3D fan-out structure for an integrated circuit device. For clarity and ease of understanding, the same reference numerals have been used to identify features in common with the example illustrated in FIGS. 3 to 9. The method starts at FIG. 11, where a substrate carrier 300 is provided. The substrate carrier 300 has first and second opposing surfaces 310, 320, and an aperture 330 extending there through. In some examples, the substrate carrier 300 may have conductive tracks or pads 340 formed on or in the surfaces 310, 320 thereof. The substrate carrier 300 may further include one or more conductive vias 350 extending there through, for example between conductive contact tracks/pads 340.

Figure 12:
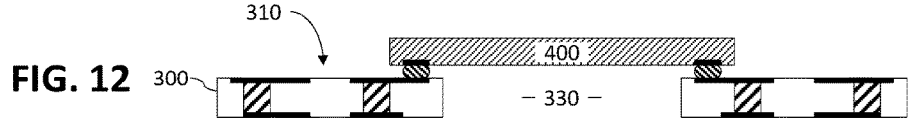

As illustrated in FIG. 12, a first semiconductor die 400 is bonded to the first surface 310 of the substrate carrier 300 such that the first semiconductor die 400 covers the aperture 330 of the substrate carrier 300.

Figure 13:
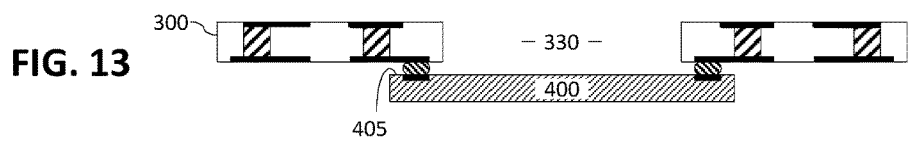

Having bonded the first semiconductor die 400 to the first surface 310 of the substrate carrier 300, the substrate carrier 300 is 'flipped' over or otherwise re-orientated (if necessary) such that the first semiconductor die 400 is located beneath the substrate carrier 300, as illustrated in FIG. 13.

Figure 14:
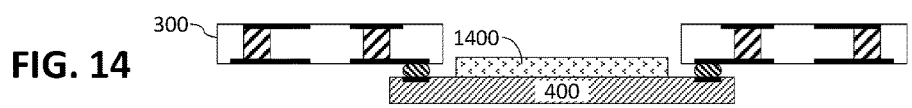
Figure 15:
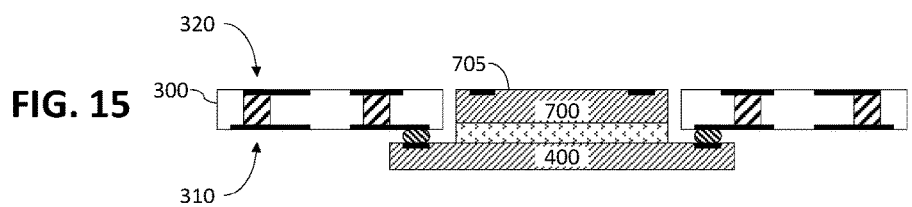
Figure 16:
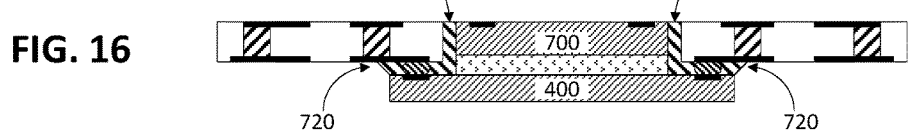

In the example method illustrated in FIGS. 11 to 18, an adhesive layer 1400, for example die attach film (DAF) tape, is applied to a region of the bonded surface of the first semiconductor die 400 exposed within the aperture 330, which in the illustrated example consists of the active surface 405 of the first semiconductor die 400, as illustrated in FIG. 14. A second semiconductor die 700 is then deposited onto the adhesive layer 1400 within the aperture 330 of the substrate carrier 300 such that an active surface 705 of the second semiconductor die 700 is coplanar with the second surface 320 of the substrate carrier 300, as illustrated in FIG. 15. Alternatively, the adhesive layer 1400 may be applied first to the surface of the second semiconductor die 700, and the semiconductor die 700 and adhesive layer 1400 may be deposited within the aperture 330 such that the adhesive layer 1400 is in contact with, and adheres to, the bonded surface of the first semiconductor die 400.

An encapsulant 1600 is then dispensed into the aperture 330 around the second semiconductor die 700 to encapsulate the second semiconductor die 700 within the aperture 330 such that the active surface 705 of the second semiconductor die 700 remains exposed and coplanar with the second surface 320 of the of the substrate carrier 300, and underfilling 720 between the first semiconductor die 400 and the first surface 310 of the substrate carrier 300.

Figure 17:
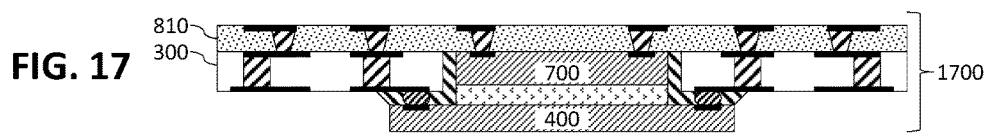
Figure 18:
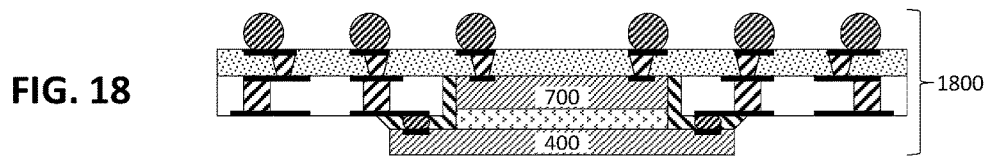

Once the encapsulant 600 has cured, one or more redistribution layers, such as illustrated generally at 810 in FIG. 17, are then applied (built up) onto the second surface 320 of the substrate carrier 300 to form a 3-Dimensional fan-out structure 1700. Ball-attach and singulation of the 3-Dimensional fan-out structure 1700 can then be performed to form an individual integrated circuit device 1800, as illustrated in FIG. 18.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

For example, the the terms 'front,' 'back,' 'top,' 'bottom,' 'over,' 'under' and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A 3-dimensional (3D) fan-out structure for an integrated circuit device, the 3D fan-out structure comprising:
   a substrate carrier having first and second opposing surfaces and an aperture extending therethrough;
   a first semiconductor die bonded and electrically connected to the first surface of the substrate carrier such that the first semiconductor die covers the aperture of the substrate carrier, thereby forming a well;
   an encapsulant and a second semiconductor die deposited within the well formed by the aperture and the first semiconductor die, wherein the second semiconductor die has an active surface that is exposed and coplanar with the second surface of the substrate carrier; and
   at least one redistribution layer applied onto the second surface of the substrate carrier and the entire exposed surface of the second semiconductor die, where bonding pads of the second semiconductor die are in direct contact with and electrically connected to the redistribution layer.

2. The 3D fan-out structure of claim 1, wherein contact pads on an active surface of the first semiconductor die are bonded to conductive pads located on the first surface of the substrate carrier.

3. The 3D fan-out structure of claim 2, wherein the first semiconductor die is flip-chip bonded to the first surface of the substrate carrier.

4. An integrated circuit device having a 3-dimensional (3D) fan-out structure for an integrated circuit device, the 3D fan-out structure comprising:
   a substrate carrier having first and second opposing surfaces and an aperture extending between the first and second surfaces;
   a first semiconductor die bonded to the first surface of the substrate carrier such that the first semiconductor die covers the aperture of the substrate carrier, wherein a well is formed by the aperture and the first semiconductor die;
   an encapsulant and a second semiconductor die deposited within the well such that an active surface of the second semiconductor die is exposed and coplanar with the second surface of the substrate carrier; and
   at least one redistribution layer applied on the second surface of the substrate carrier and the entire exposed surface of the second semiconductor die, wherein bonding pads on the exposed surface of the second semiconductor die are in direct contact with and electrically connected to the at least one redistribution layer.

5. The integrated circuit device of claim 4, wherein contact pads on an active surface of the first semiconductor die are bonded to conductive pads located on the first surface of the substrate carrier.

6. The integrated circuit device of claim 5, wherein the first semiconductor die is flip-chip bonded to the first surface of the substrate carrier.

* * * * *